US011665451B2

(12) United States Patent
Seo et al.

(10) Patent No.: US 11,665,451 B2
(45) Date of Patent: May 30, 2023

(54) IMAGE SENSOR, IMAGING DEVICE HAVING THE IMAGE SENSOR, AND OPERATING METHOD THEREOF

(71) Applicant: SAMSUNG ELECTRONICS CO., LTD., Suwon-si (KR)

(72) Inventors: Minwoong Seo, Hwaseong-si (KR); Daehoon Kim, Seoul (KR); Seungsik Kim, Hwaseong-si (KR); Dongmo Im, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 77 days.

(21) Appl. No.: 16/917,162

(22) Filed: Jun. 30, 2020

(65) Prior Publication Data
US 2021/0160448 A1    May 27, 2021

(30) Foreign Application Priority Data

Nov. 27, 2019   (KR) .......................... 10-2019-0154073

(51) Int. Cl.
*H04N 25/75* (2023.01)
*H01L 27/146* (2006.01)
*H01L 27/148* (2006.01)
*H04N 25/59* (2023.01)
*H04N 25/621* (2023.01)
*H04N 25/771* (2023.01)
*H04N 25/57* (2023.01)
*H04N 25/76* (2023.01)

(52) U.S. Cl.
CPC ....... *H04N 25/75* (2023.01); *H01L 27/14612* (2013.01); *H01L 27/14643* (2013.01); *H01L 27/14812* (2013.01); *H04N 25/59* (2023.01)

(58) Field of Classification Search
CPC .... H04N 5/378; H04N 5/3559; H04N 5/3591; H04N 5/37452; H04N 5/355; H04N 5/374; H04N 5/2355; H04N 5/235; H04N 5/351; H04N 5/35536; H04N 5/35572; H04N 5/369; H04N 5/3745; H01L 27/14612; H01L 27/14643; H01L 27/14812; H01L 27/14609; H01L 27/1463; H01L 27/14621
See application file for complete search history.

(56) References Cited

U.S. PATENT DOCUMENTS

| 7,075,049 B2 | 7/2006 | Rhodes et al. |
| 8,928,792 B1 | 1/2015 | Hynecek et al. |
| 8,987,646 B2 * | 3/2015 | De Witt ................. H04N 5/378 257/292 |
| 9,787,921 B2 | 10/2017 | Kim |
| 9,888,191 B2 | 2/2018 | Beck |

(Continued)

FOREIGN PATENT DOCUMENTS

JP      5456652 B2    4/2014

*Primary Examiner* — Albert H Cutler
(74) *Attorney, Agent, or Firm* — Sughrue Mion, PLLC

(57) ABSTRACT

An operating method of an image sensor, including performing a first sampling operation corresponding to first illumination in at least one pixel; performing a second sampling operation corresponding to second illumination in the at least one pixel; and outputting a first pixel voltage corresponding to the first sampling operation, or outputting a second pixel voltage corresponding to the second sampling operation, in the at least one pixel.

19 Claims, 13 Drawing Sheets

(56) References Cited

U.S. PATENT DOCUMENTS

| | | | |
|---|---|---|---|
| 9,900,481 B2 | 2/2018 | Geurts et al. | |
| 2007/0035649 A1 | 2/2007 | McKee | |
| 2009/0256060 A1* | 10/2009 | Meynants | H04N 5/3575 250/214 A |
| 2010/0079632 A1* | 4/2010 | Walschap | H04N 5/37452 348/294 |
| 2014/0077271 A1* | 3/2014 | Fujii | H01L 31/18 438/59 |
| 2015/0115332 A1 | 4/2015 | Hynecek et al. | |
| 2015/0245019 A1* | 8/2015 | Engelbrecht | H04N 5/3742 348/175 |
| 2017/0104946 A1* | 4/2017 | Hong | H01L 27/14627 |
| 2019/0327432 A1* | 10/2019 | Milkov | H01L 27/14634 |
| 2019/0373168 A1* | 12/2019 | Balar | H04N 5/2253 |
| 2020/0389614 A1* | 12/2020 | Benjaram | H01L 27/14603 |

\* cited by examiner

IMAGE SENSOR, IMAGING DEVICE HAVING THE IMAGE SENSOR, AND OPERATING METHOD THEREOF

CROSS-REFERENCE TO RELATED APPLICATION(S)

This application is based on and claims priority under 35 U.S.C. § 119 to Korean Patent Application No. 10-2019-0154073 filed on Nov. 27, 2019 in the Korean Intellectual Property Office, the disclosure of which is incorporated herein by reference in its entirety.

BACKGROUND

1. Field

The present disclosure relates to an image sensor, an imaging device having the same, and an operating method thereof.

2. Description of Related Art

In general, an image sensor may an optical image into an electrical signal. Recently, with a development of the computing and communication industries, demand for an improved image sensor in various fields is increasing. An image sensor may include a charge coupled device (CCD) and complementary metal-oxide-semiconductor (CMOS) image sensors. The CMOS image sensor can be easily driven, and may integrate a signal processing circuit on a single chip, thereby miniaturizing a product. The CMOS image sensor also has very low power consumption, such that it may be easily applied to a product with limited battery capacity. Also, the CMOS image sensor may be used interchangeably with a CMOS process technology, thereby reducing manufacturing costs. Therefore, a use of the CMOS image sensor is rapidly increasing as high resolution is realized with technological development.

SUMMARY

Provided is an image sensor having a wide dynamic range, an imaging device having the same, and an operating method thereof.

According to an embodiment, an image sensor includes a first sampling capacitor corresponding to first illumination connected to a power supply terminal; a second sampling capacitor corresponding to second illumination connected to the power supply terminal; a third sampling capacitor connected between a first sampling node and a second sampling node; a first transistor connected between a photodiode and a floating diffusion node and configured to be controlled by a transfer gate signal; a second transistor connected between the power supply terminal and an expansion node and configured to be controlled by a reset gate signal; a third transistor connected between the expansion node and the floating diffusion node and configured to be controlled by a conversion gain gate signal; a fourth transistor having a drain connected to the power supply terminal, a source connected to a sampling node, and a gate connected to the floating diffusion node; a fifth transistor connected between the sampling node and a ground terminal and configured to be controlled by a pass signal; a sixth transistor connected between the sampling node and the first sampling node and configured to be controlled by a sampling signal; a seventh transistor connected between the first sampling capacitor and the first sampling node and configured to be controlled by a first switch signal; an eighth transistor connected between the second sampling capacitor and the first sampling node and configured to be controlled by a second switch signal; a ninth transistor connected between the power supply terminal and the second sampling node and configured to be controlled by an operating signal; a tenth transistor having a drain connected to the power supply terminal and a gate connected to the second sampling node; and an eleventh transistor connected between a source of the tenth transistor and a corresponding column line and configured to be controlled by a selection signal.

According to an embodiment, an imaging device includes at least one pixel array having a plurality of pixels connected between a plurality of row lines and a plurality of column lines; a row driver configured to select row lines from among the plurality of row lines; a read-out circuit configured to receive analog pixel signals from column lines from among the plurality of column lines corresponding to pixels from among the plurality of pixels connected to the selected row lines, and to convert the received analog pixel signals into digital signals; a column driver configured to output image data corresponding to the column lines based on the digital signals; a timing controller configured to control an operation timing of the at least one pixel array, the row driver, the read-out circuit, and the column driver; and an image signal processor configured to process the image data output from the column driver, wherein each of the plurality of pixels is configured to perform a first sampling operation corresponding to first illumination and a second sampling operation corresponding to second illumination lower than the first illumination.

According to an embodiment, an operating method of an image sensor includes performing a first sampling operation corresponding to first illumination in at least one pixel; performing a second sampling operation corresponding to second illumination in the at least one pixel; and outputting a first pixel voltage corresponding to the first sampling operation, or outputting a second pixel voltage corresponding to the second sampling operation, in the at least one pixel.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, embodiments will be described clearly and in detail with reference to the accompanying drawings. The embodiments described herebelow are all exemplary, and thus, the inventive concept is not limited to these embodiments disclosed below and may be realized in various other forms.

Figure 1:
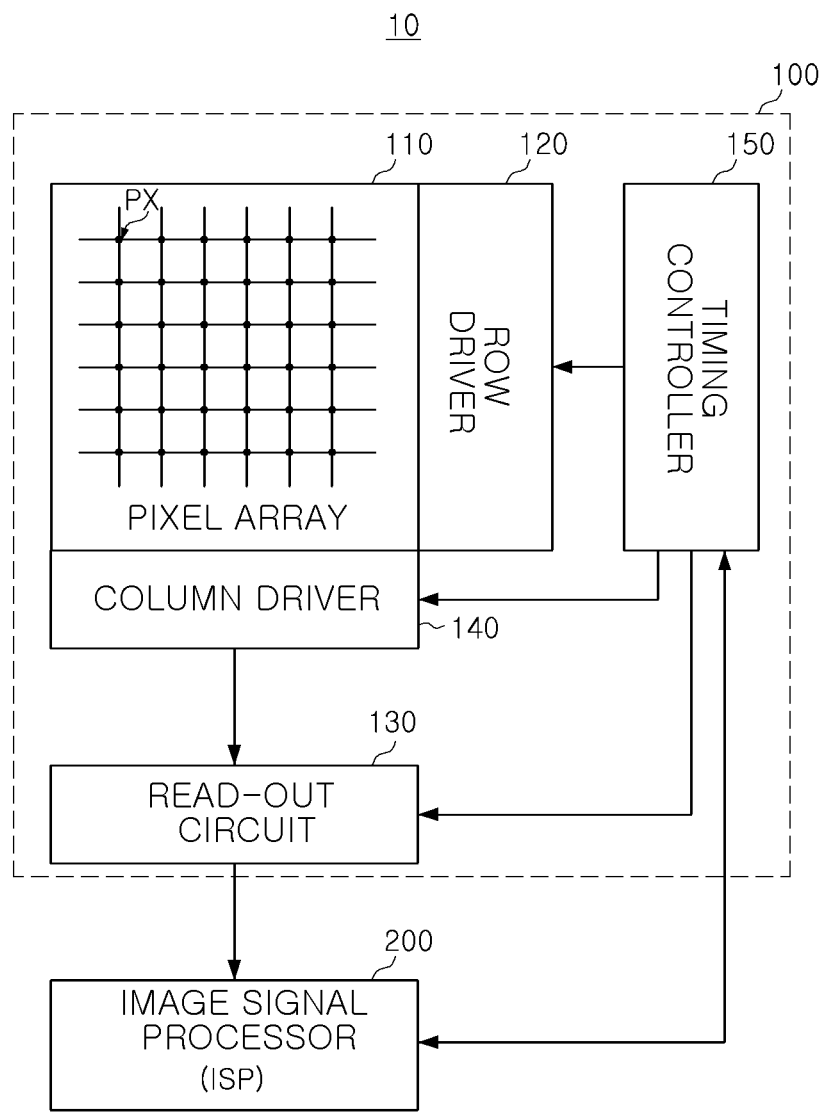
FIG. 1 is a view schematically illustrating an imaging device 10 according to an example embodiment.

FIG. 1 is a diagram illustrating an imaging device 10 according to an example embodiment. Referring to FIG. 1, an imaging device 10 may include an image sensor 100 and an image signal processor (ISP) 200.

The image sensor 100 may be configured to detect an object. The image sensor 100 may include a pixel array 110, a row driver 120, a read-out circuit 130, a column driver 140, and a timing controller 150.

The pixel array 110 may include a plurality of pixels disposed in an array form along a plurality of row lines and a plurality of column lines. Each of the plurality of pixels may include a color filter to pass certain wavelengths of light. For example, the color filter may pass wavelengths of a particular color region from among the visible region of wavelengths. For example, the color filter may be at least one of a red filter passing wavelengths of a red region, a green filter passing wavelengths of a green region, and a blue filter passing wavelengths of a blue region. Also, the color filter may be at least one of a cyan filter, a yellow filter, and a magenta filter.

In an example embodiment, each of the plurality of pixels may include a photoelectric conversion element. For example, each of the plurality of pixels PX may include a photodiode generating a charge in response to an externally incident optical signal, and a pixel circuit generating an electrical signal corresponding to the charge generated from the photodiode. Here, the photodiode may be a PIN photodiode having a structure into which an intrinsic semiconductor layer is inserted between PN junctions. Also, the photodiode may also be an avalanche photodiode (APD) having an avalanche layer between the PN junctions.

In an example embodiment, each of the plurality of pixels may include at least two photodiodes. For example, each of the pixels may include at least two diodes to generate a pixel signal corresponding to various colors of light or to provide an autofocus function.

Also, each of the pixels may include a pixel circuit for generating a pixel signal from the charge generated by the photodiodes. Here, the pixel circuit may include a transfer transistor, a driving transistor, for example a source-follower transistor, a selection transistor, a reset transistor, and at least one conversion gain transistor. The pixel circuit may obtain a pixel signal by detecting a reset voltage and a pixel voltage from each of the plurality of pixels and calculating a difference thereof. The pixel voltage may be a voltage corresponding to the charge generated in the photodiodes included in each of the plurality of pixels.

Also, the pixel circuit may be configured to vary a conversion gain. In an example embodiment, variability of the conversion gain may be performed by turning on or off at least one transistor. For example, the pixel circuit may perform a dual-conversion gain according to whether the conversion gain transistor is turned on or off.

Also, the pixel circuit may be configured to perform a sampling operation according to various illuminations. In an example embodiment, the pixel circuit may perform a dual-sampling operation using sampling capacitors. For example, the pixel circuit may perform a first sampling operation corresponding to high illumination, and a second sampling operation corresponding to low illumination.

In an example embodiment, at least two pixels adjacent to each other may constitute one pixel group. Here, the two or more pixels included in the pixel group may share at least some of the transfer transistor, the driving transistor, the selection transistor, the reset transistor, and the conversion gain transistor.

The row driver 120 may be configured to drive the pixel array 110 in a unit of rows. For example, the row driver 120 may generate a transfer control signal controlling the transfer transistor of the pixel circuit, a reset control signal controlling the reset transistor, or a selection control signal controlling the selection transistor.

The read-out circuit 130 may be configured to convert and output an analog pixel signal generated from the pixel array 110 into a digital signal. The read-out circuit 130 may include a sampling circuit and an analog-to-digital converter (ADC). The sampling circuit may include a plurality of samplers. For example, a sampler of the plurality of samplers may be a correlated double sampler (CDS). The sampler may be connected to pixels included in the row line selected by the row driver 120 through the column lines, and may detect a reset voltage and a pixel voltage from the corresponding pixels. The samplers may compare each of the reset voltage and the pixel voltage with the ramp voltage, and output a result thereof. The ADC may convert the comparison result output by the samplers into a digital signal and output the digital signal. The ADC may convert the reset voltage and the pixel voltage detected by the correlated double sampler into a digital signal and transfer the converted digital signal to the column driver 140.

The column driver 140 may include a latch or buffer circuit and an amplifying circuit for temporarily storing a digital signal. The column driver 140 may process the digital signal received from the read-out circuit 130. For example, the column driver 140 may output image data corresponding to the column lines selected from the plurality of column lines among the digital signals to the image signal processor 200.

The timing controller 150 may be configured to control an operation timing of the row driver 120, the read-out circuit 130, or the column driver 140. In particular, the timing controller 150 may adjust a pixel operation timing for varying the conversion gain. Also, the timing controller 150 may adjust the pixel operation timing for performing a multi-sampling operation according to the illumination.

The image signal processor 200 may be configured to process image data output from the read-out circuit 130. For example, the image signal processor 200 may process image data to generate a result image, and transmit the result image to the display or store the result image in a memory. For example, the image signal processor 200 may perform a signal process operation such as color interpolation, color correction, gamma correction, color space conversion, edge correction, and the like, to generate image data.

The imaging device 10 according to an example embodiment may include an image sensor 100 having pixels which may vary a conversion gain and perform multi-sampling per illumination, thereby securing a high dynamic range (HDR).

Figure 2:
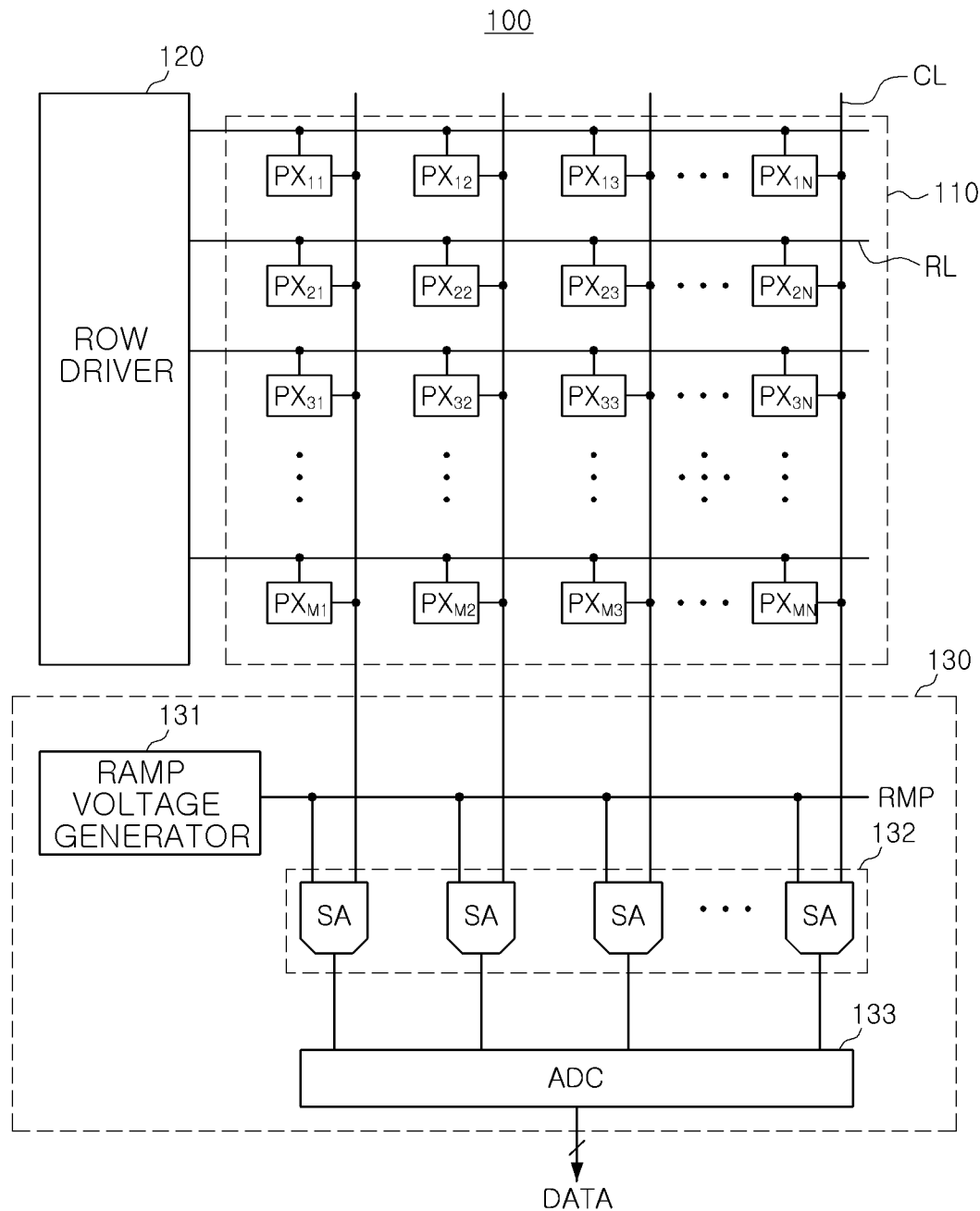
FIG. 2 is a view schematically illustrating an image sensor 100 according to an example embodiment.

FIG. 2 is a view schematically illustrating an image sensor 100 according to an example embodiment. Referring to FIG. 2, the image sensor 100 may include a pixel array 110, a row driver 120, and a read-out circuit 130.

The pixel array 110 may include a plurality of pixels $PX_{11}$ and $PX_{MN}$ provided at intersections of a plurality of row lines RL and a plurality of column lines CL.

The row driver 120 may input a signal necessary to control the plurality of pixels $PX_{11}$ to $PX_{MN}$ through the plurality of row lines RL. For example, the row driver 120 may provide the reset control signal, which may be a reset gate signal RG, the transmission control signal, which may be a transfer gate signal TG, or the selection control signal, which may be a selection signal SL, to the plurality of pixels $PX_{11}$ to $PX_{MN}$ through the plurality of row lines RL. The row driver 120 may sequentially select each of the plurality of row lines RL. The row driver 120 may select one of the plurality of row lines RL during a predetermined horizontal period.

The read-out circuit 130 may include a ramp voltage generator 131, a sampling circuit 132, and an ADC 133. Data output from the ADC 133 may be input to, for example, the column driver 140 of FIG. 1.

The ramp voltage generator 131 may be configured to generate a ramp signal RMP in response to a ramp activation signal. The ramp signal may be a signal in which a voltage increases or decreases in proportion to time.

The sampling circuit 132 may obtain a reset voltage and a pixel voltage from some pixels connected to the row line scanned by the row driver 120 among the plurality of pixels $PX_{11}$ to $PX_{MN}$. The sampling circuit 132 may include a plurality of samplers SA, and the plurality of samplers SA may include a correlated double sampler. Each of the samplers SA may receive a ramp signal RMP of the ramp voltage generator 131 through a first input terminal, and receive a reset voltage/pixel voltage from the plurality of pixels $PX_{11}$ to $PX_{MN}$ through a second input terminal.

The ADC 133 may output pixel data by converting an analog signal of the sampling circuit 132 into a digital signal.

In embodiments, the image sensor 100 may be implemented in a two-stack structure. For example, pixel arrays and peripheral circuits, for example row decoders, CDS, and ADC, may be disposed on a first layer, and logic circuits, for example power supply circuits, I/O interfaces, ISP, and the like, may be configured on a second layer. In another example, only the pixel array may be disposed on the first layer, and the peripheral circuits and logic circuits may be disposed on the second layer.

In embodiments, the pixel PX according to an example embodiment may be implemented in dual-conversion gain and dual-sampling capacitor structures.

Figure 3:
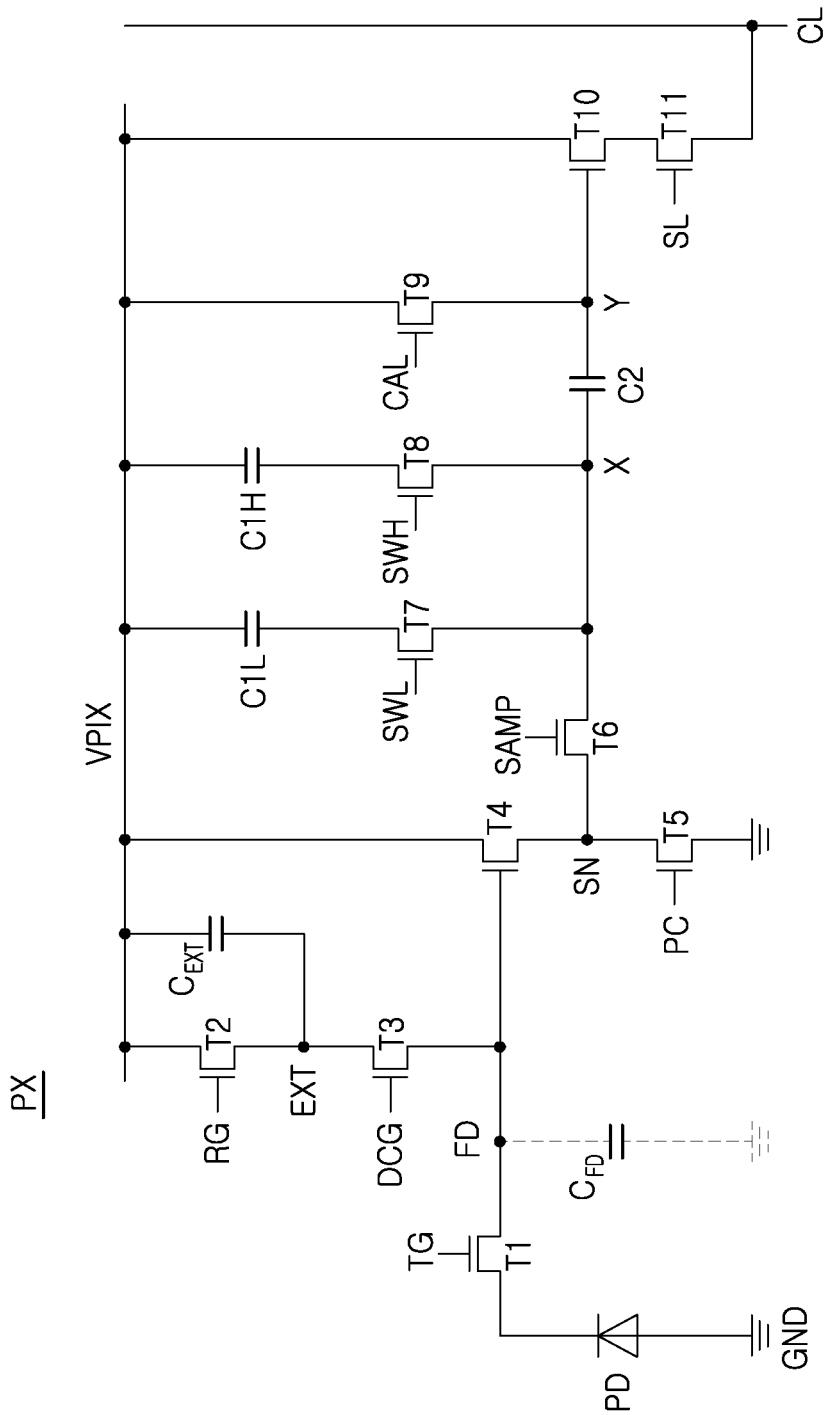
FIG. 3 is a view schematically illustrating a pixel PX according to an example embodiment.

FIG. 3 is a view schematically illustrating a pixel PX according to an example embodiment. Referring to FIG. 3, the pixel PX may include a photodiode PD and first to eleventh transistors T1 to T11.

The photodiode PD may be connected to a ground terminal GND.

The first transistor T1 may be connected between the photodiode PD and a floating diffusion node FD, and may be controlled by a transfer gate signal TG. In embodiments, the floating diffusion node FD may include a floating diffusion capacitor $C_{FD}$ corresponding to a floating diffusion region.

The second transistor T2 may be connected between a power supply terminal VPIX providing a pixel driving voltage and an expansion node EXT, and may be controlled by the reset gate signal RG. In an example embodiment, an expansion capacitor $C_{EXT}$ may be connected between the power supply terminal VPIX and the expansion node EXT. In another example embodiment, the expansion capacitor $C_{EXT}$ may be connected between a ground terminal GND and the expansion node EXT.

The third transistor T3 may be connected between the expansion node EXT and the floating diffusion node FD, and may be controlled by a conversion gain gate signal DCG.

The fourth transistor T4 may include a drain connected to the power supply terminal VPIX, a source connected to the sampling node SN, and a gate connected to the floating diffusion node FD.

The fifth transistor T5 may be connected to the sampling node SN and the ground terminal GND, and may be controlled by a pass signal PC.

The sixth transistor T6 may be connected between the sampling node SN and a first sampling node X, and may be controlled by the sampling signal SAMP.

The seventh transistor T7 may be connected between a first sampling capacitor C1L for first illumination and the first sampling node X, and may be controlled by a first switch signal SWL. Here, the first sampling capacitor C1L for the first illumination may be connected between the power supply terminal VPIX and a drain of the seventh transistor T7. Here, the first illumination may be high illumination.

The eighth transistor T8 may be connected between a second sampling capacitor C1H for second illumination and the first sampling node X, and may be controlled by a second switch signal SWH. Here, the second sampling capacitor C1H for the second illumination may be connected between the power supply terminal VPIX and a drain of the eighth transistor T8. Here, the second illumination may be low illumination.

The ninth transistor T9 may be connected between the power supply terminal VPIX and a second sampling node Y, and may be controlled by an operating signal CAL. Here, a third sampling capacitor C2 may be connected between the first sampling node X and the second sampling node Y.

The tenth transistor T10 may include a drain connected to the power supply terminal VPIX and a gate connected to the second sampling node Y.

The eleventh transistor T11 may be connected between a source of the tenth transistor T10 and a corresponding column lines CL, and may be controlled by a selection signal SL.

The pixel PX according to an example embodiment may perform a dual-conversion gain, and may perform a dual-sampling operation according to the first and second illuminations.

Figure 4:
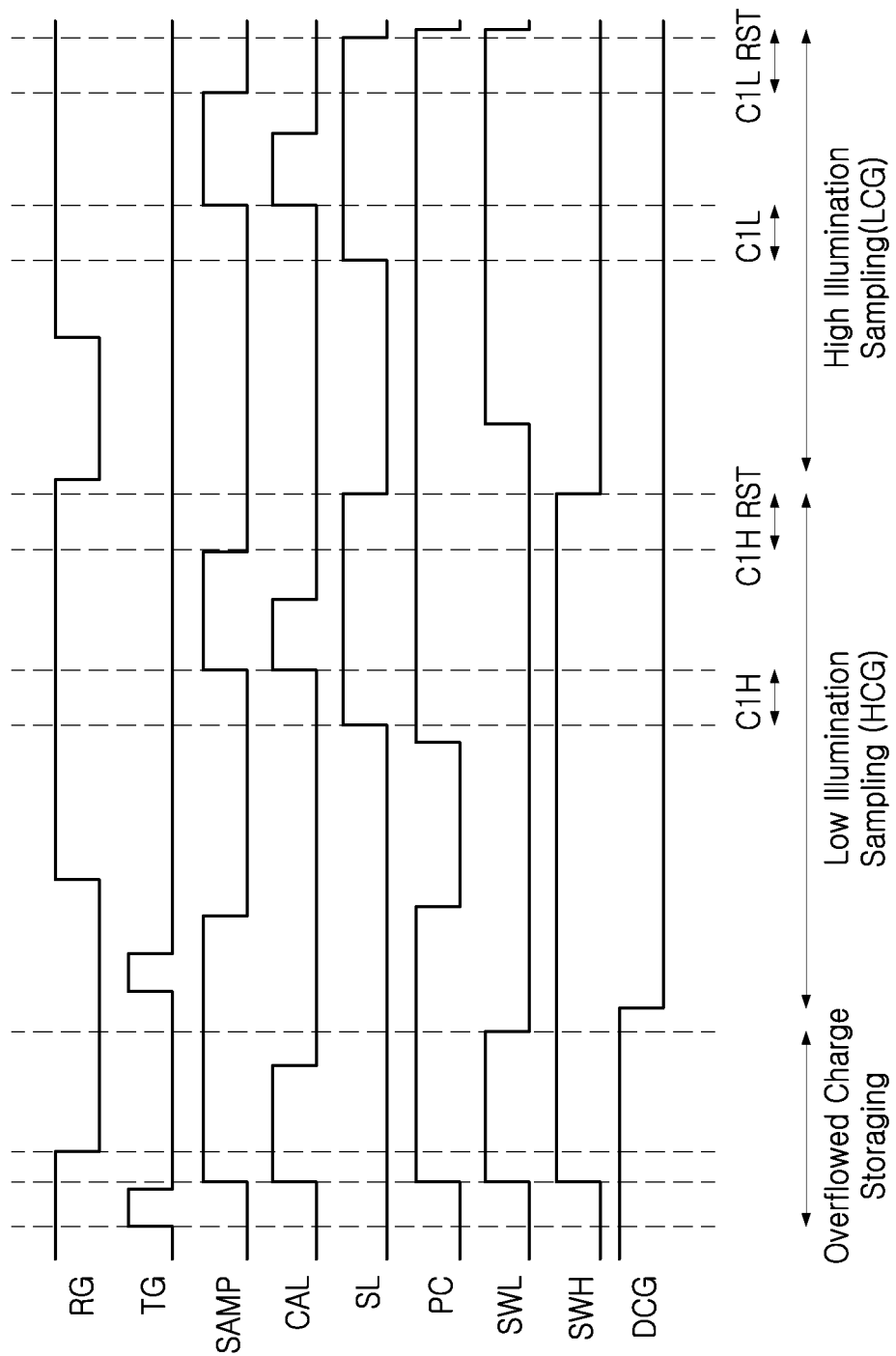
FIG. 4 is a timing diagram schematically illustrating an operation of the pixel PX shown in FIG. 3 according to an example embodiment.

FIG. 4 is a timing diagram schematically illustrating an operation of the pixel PX shown in FIG. 3. Referring to FIGS. 3 and 4, the pixel PX may operate as follows.

First, the pixel PX may perform an operation of storing overflowed charges to the sampling capacitors C1L, C1H, and C2 in floating diffusion node FD. When the reset gate signal RG is in a high-level state, the transfer gate signal TG may be in a high-level state. In this case, because the conversion gain gate signal DCG is in a high-level state, the charges of the photodiode PD may be transferred to a region formed by the floating diffusion node FD and the expansion capacitor $C_{EXT}$. Also, the sampling signal SAMP, the pass signal PC, the first switch signal SWL, and the second switch signal SWH are in a high-level, the charges stored in the floating diffusion node FD and the expansion capacitor $C_{EXT}$ may be transferred to the first sampling capacitor C1L for the first illumination, the second sampling capacitor C1H for the second illumination, and the third sampling capacitor C2. Thus, charges overflowed from the photodiode PD may be stored in the sampling capacitors C1L, C1H, and C2.

In embodiments, after the overflowed charges are stored in the sampling capacitors C1L, C1H, and C2, a low illumination sampling operation may be performed. After the transfer gate signal TG is maintained in a high-level state, the sampling signal SAMP and the pass signal PC may be maintained at a high-level for a predetermined time. In this case, because the first switch signal SWL is in the low-level state and the second switch signal SWH is in the high-level state, the second sampling capacitor C1H for the second illumination may store the charges of the floating diffusion node FD. Here, the second illumination may be low illumination having a high conversion gain (HCG). Thereafter, by changing the pass signal PC and the selection signal SL to a high-level state, a signal voltage of the second sampling capacitor C1H for the second illumination may be read. Thereafter, while the sampling signal SAMP is in the high-level state, the operating signal CAL may be maintained in the high-level state for a predetermined time. As a result, charges for a reset state C1H RST may be stored in the second sampling capacitor C1H for the second illumination. Thereafter, the sampling signal SAMP may be read by a reset voltage of the second sampling capacitor C1H for the second illumination for a predetermined time in the low-level state. Through the above-described process, a low illumination sampling operation may be performed.

In embodiments, after a low illumination sampling operation is performed, a high illumination sampling (operation may be performed. Because the first switch signal is in the high-level state and the second switch signal SWH is in the low-level state, when the selection signal SL is in the low-level state, the first sampling capacitor C1L for the first illumination may store charges of the floating diffusion node FD. Here, the first illumination may be high illumination having a low conversion gain (LCG). Thereafter, by changing the pass signal PC to the high-level state, a signal voltage of the first sampling capacitor C1L for the first illumination may be read. Thereafter, while the sampling signal SAMP is in the high-level state, the operating signal CAL may be maintained in the high-level state for a predetermined time. Thus, the charges for the reset state C1L RST may be stored in the first sampling capacitor C1L for the first illumination. Thereafter, the sampling signal SAMP may be read by a reset voltage of the first sampling capacitor C1L for the first illumination for a predetermined time in the low-level state. Through the above-described process, the high illumination sampling operation may be performed.

FIGS. 5A, 5B, 5C, and 5D are views conceptually illustrating a sampling operation of a pixel PX in high illumination, according to embodiments.

Figure 5A:
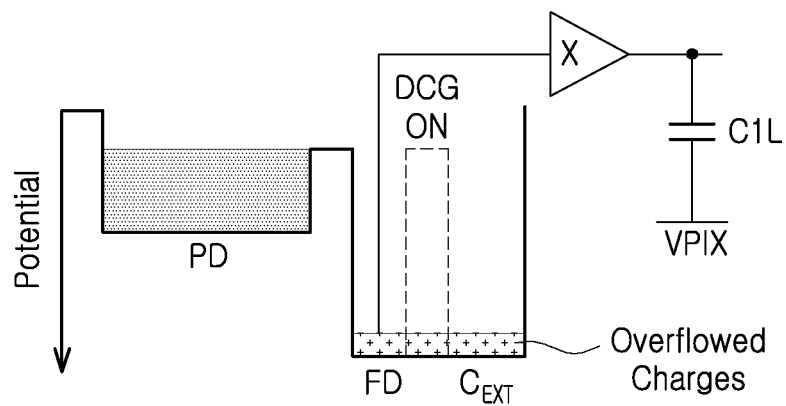
FIGS. 5A, 5B, and 5C are views conceptually illustrating a sampling operation of the pixel PX in high illumination according to example embodiments.

An overflowed charge may be generated in high illumination. Referring to FIG. 5A, the pixel PX may store the overflowed charges from the photodiode PD in response to the conversion gain gate signal DCG in the turned-on state in a region formed by the floating diffusion node FD and the expansion capacitor $C_{EXT}$. When the sampling signal SAMP and the first switch signal SWL are in the high-level state, the first sampling capacitor C1L for the first illumination may store charges corresponding to the overflowed charges.

Figure 5B:
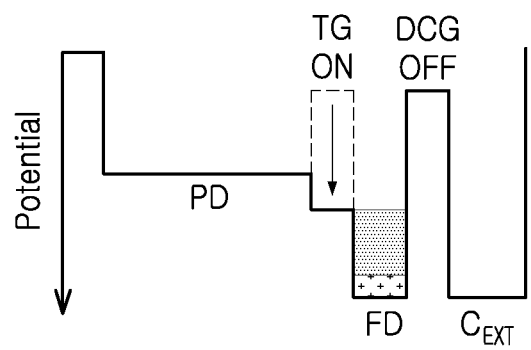

After the overflowed charges are stored in the first sampling capacitor C1L for the first illumination, as shown in FIG. 5A, the transfer gain gate signal DCG may be in a turned-off state while the conversion gain gate signal DCG is in the turned-off state, as shown in FIG. 5B. In FIG. 5B, the charges of the photodiodes PD may be transferred to the floating diffusion node FD. As a result, the floating diffusion node FD may store charges overflowed from the photodiode PD and charges transferred from the photodiode PD.

After the charges of the photodiode PD are stored in the floating diffusion node FD, as shown in FIG. 5B, the transfer gate signal TG may be turned off, as shown in FIG. 5B. When the sampling signal SAMP and second switch signal SWH are in the high-level state, the second sampling capacitor C1H for the second illumination may store charges corresponding to the charges stored in the photodiode PD.

Figure 5C:
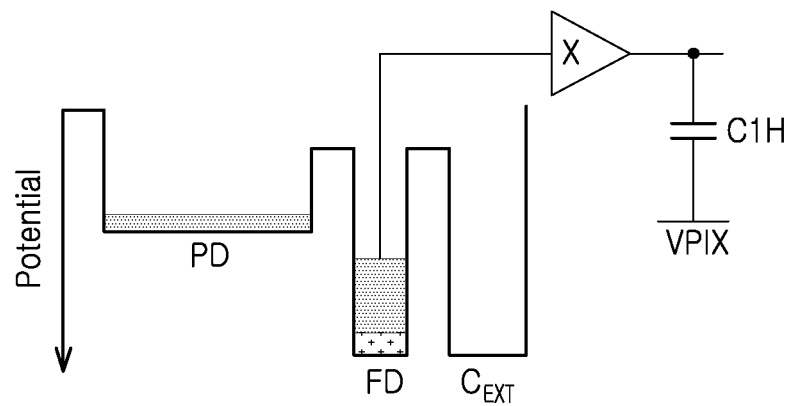

As described above, the sampling operation of the pixel PX in the case of high illumination may be completed through the processes shown in FIGS. 5A, 5B, and 5C.

Figure 6A:
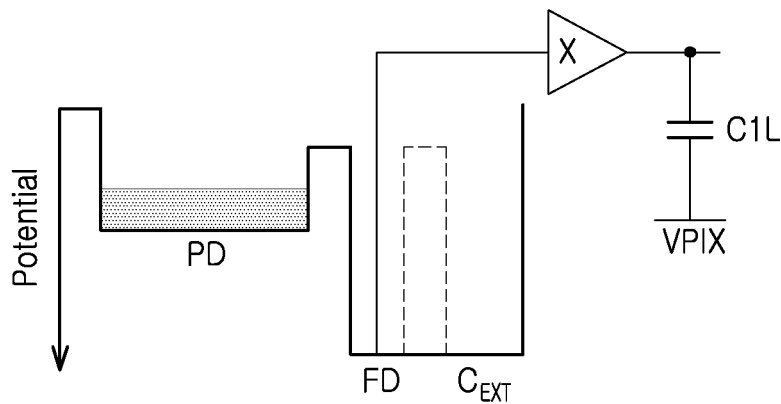
FIGS. 6A, 6B, and 6C are views conceptually illustrating a sampling operation of the pixel PX in low illumination according to example embodiments.
Figure 6B:
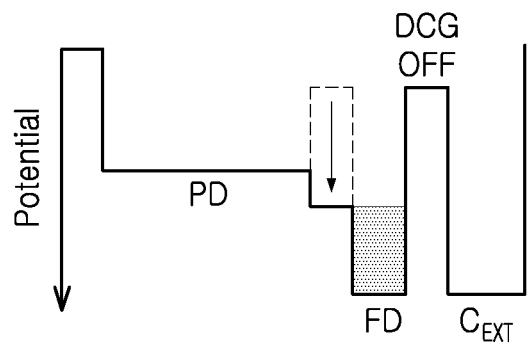
Figure 6C:
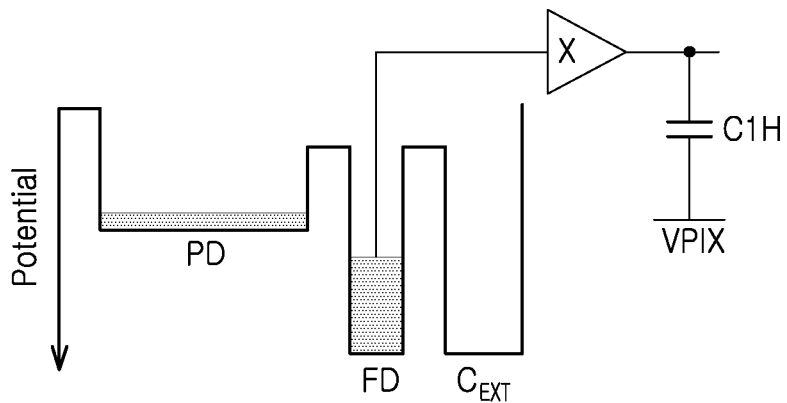

FIGS. 6A, 6B, and 6C are views conceptually illustrating a sampling operation of a pixel PX in low illumination, according to an embodiment.

The overflowed charges as shown in FIG. 5A may not occur in low illumination. Referring to FIG. 6A, the pixel PX may store charges from the photodiode PD in response to the conversion gain gate signal DCG in the turned-on state in a region formed by the floating diffusion node FD and the expansion capacitor $C_{EXT}$. Because there are no charges overflowed from the photodiode PD, an amount of charges of the first sampling capacitor for the first illumination will not be changed.

Thereafter, referring to FIG. 6B, the transfer gate signal TG may be turned on while the conversion gain gate signal DCG is turned off. As shown in FIG. 6B, the charges of the photodiode PD may be transferred to the floating diffusion node FD. As a result, the floating diffusion node FD may store charges transferred from the photodiode PD.

After the charges of the photodiode PD are stored in the floating diffusion node FD as shown in FIG. 6B, referring to FIG. 6C, the transfer gate signal TG may be turned off. When the sampling signal SAMP and the second switch signal SWH are in the high-level state, the second sampling capacitor C1H for the second illumination may store charges corresponding to the charges stored in the photodiode PD.

As described above, the sampling operation of the pixel PX in the case of low illumination may be completed through the processes shown in FIGS. 6A, 6B, and 6C.

In embodiments, the pixel may add a small-sized photodiode for light emitting diode (LED) flicker mitigation.

Figure 7:
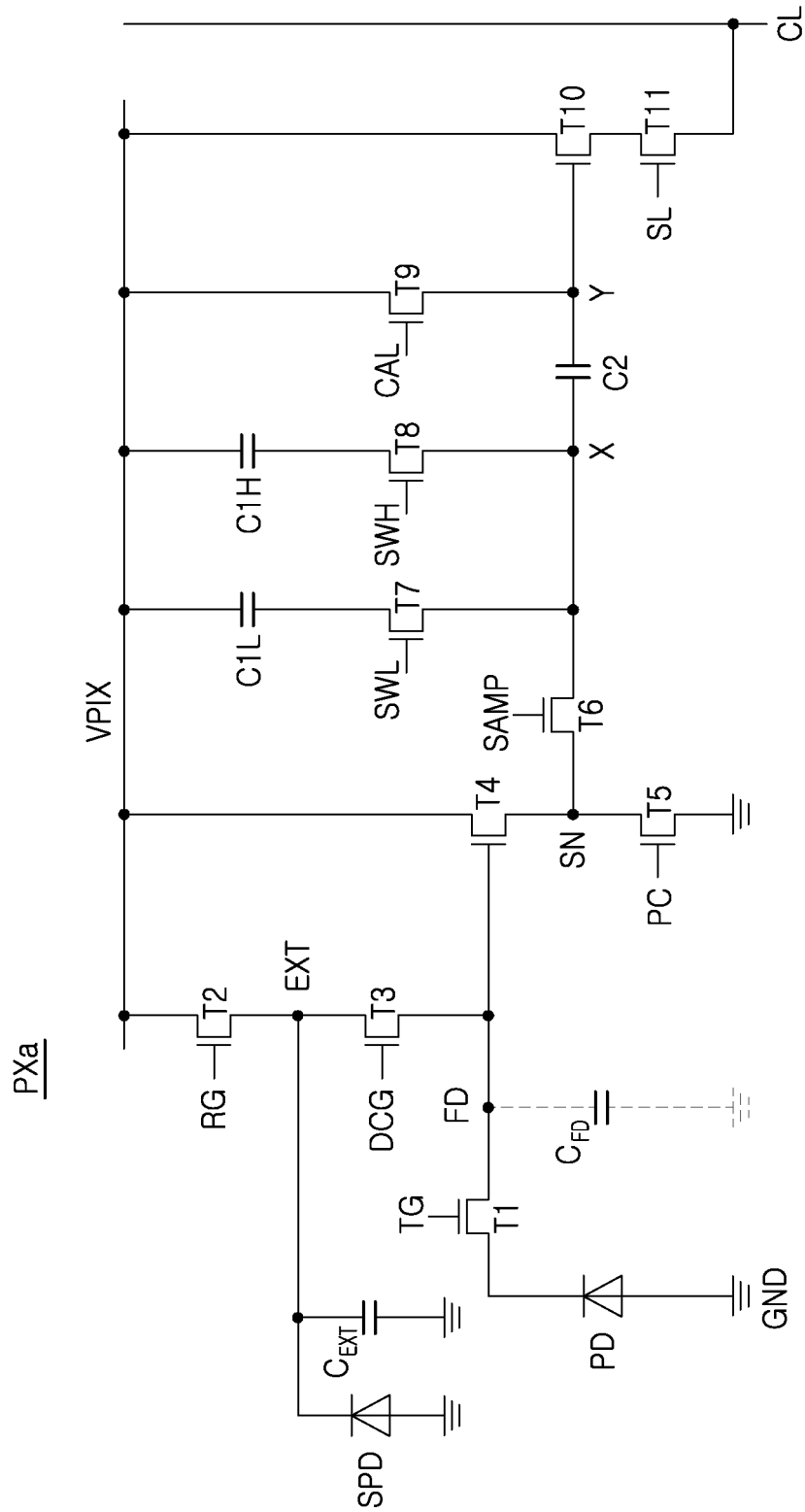
FIG. 7 is a view schematically illustrating a pixel PXa according to another example embodiment.

FIG. 7 is a view schematically illustrating a pixel PXa according to another example embodiment. Referring to FIG. 7, the pixel PXa differs from the pixel PX illustrated in FIG. 3 in that the pixel PXa adds a secondary photodiode (SPD) connected between the expansion node EXT and a ground terminal GND and the expansion capacitor $C_{EXT}$ is connected to the ground terminal GND, rather than a power supply terminal VPIX.

The pixel PXa according to an example embodiment may correspond to LED flicker mitigation by using a small-size PD only for long exposure (>10 ms).

Also, the pixel PXa according to an example embodiment may store HCC/LCG signal data in-pixel at a minimum time interval by adding C1H and C1L. As a result, high dynamic range (HDR) and motion artifact may be minimized.

In embodiments, pixels PX and PXa shown in FIGS. 3 to 7 are pixels having a transistor T3 to implement dual-conversion gain. However, pixels may not use transistors to implement dual-conversion gain. For example, a pixel may implement the dual-conversion gain by using a time difference of a charge transfer of the transfer transistor. For example, the transfer transistor may transfer charges to the floating diffusion node FD for a time shorter than a reference value in high illumination, and may transfer charges to the floating diffusion node FD for a time longer than the reference value in low illumination.

Figure 8:
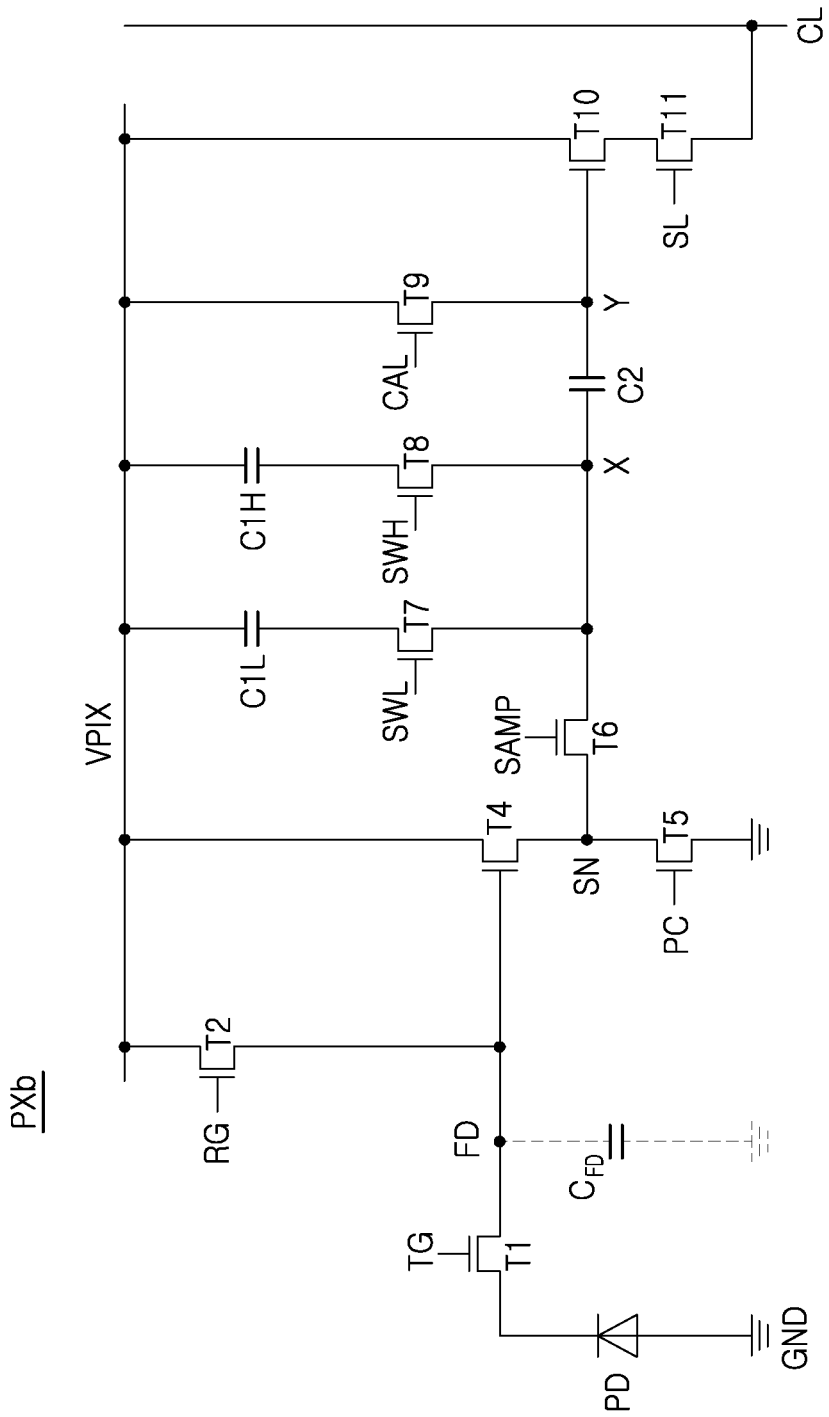
FIG. 8 is a view schematically illustrating a pixel PXb according to another example embodiment.

FIG. 8 is a view schematically illustrating a pixel PXb according to another example embodiment. Referring to FIG. 8, the pixel PXb differs from the pixel PX illustrated in FIG. 3 in that the third transistor T3 is omitted.

In embodiments, the pixels PX, PXa, and PXb illustrated in FIGS. 3 to 8 include sampling capacitors C1L, C1H, and C2 having a gamma (Γ) structure. However, the type of sampling capacitors need not be limited to the gamma type. For example, sampling capacitors may be implemented in a pi (π) type structure.

Figure 9:
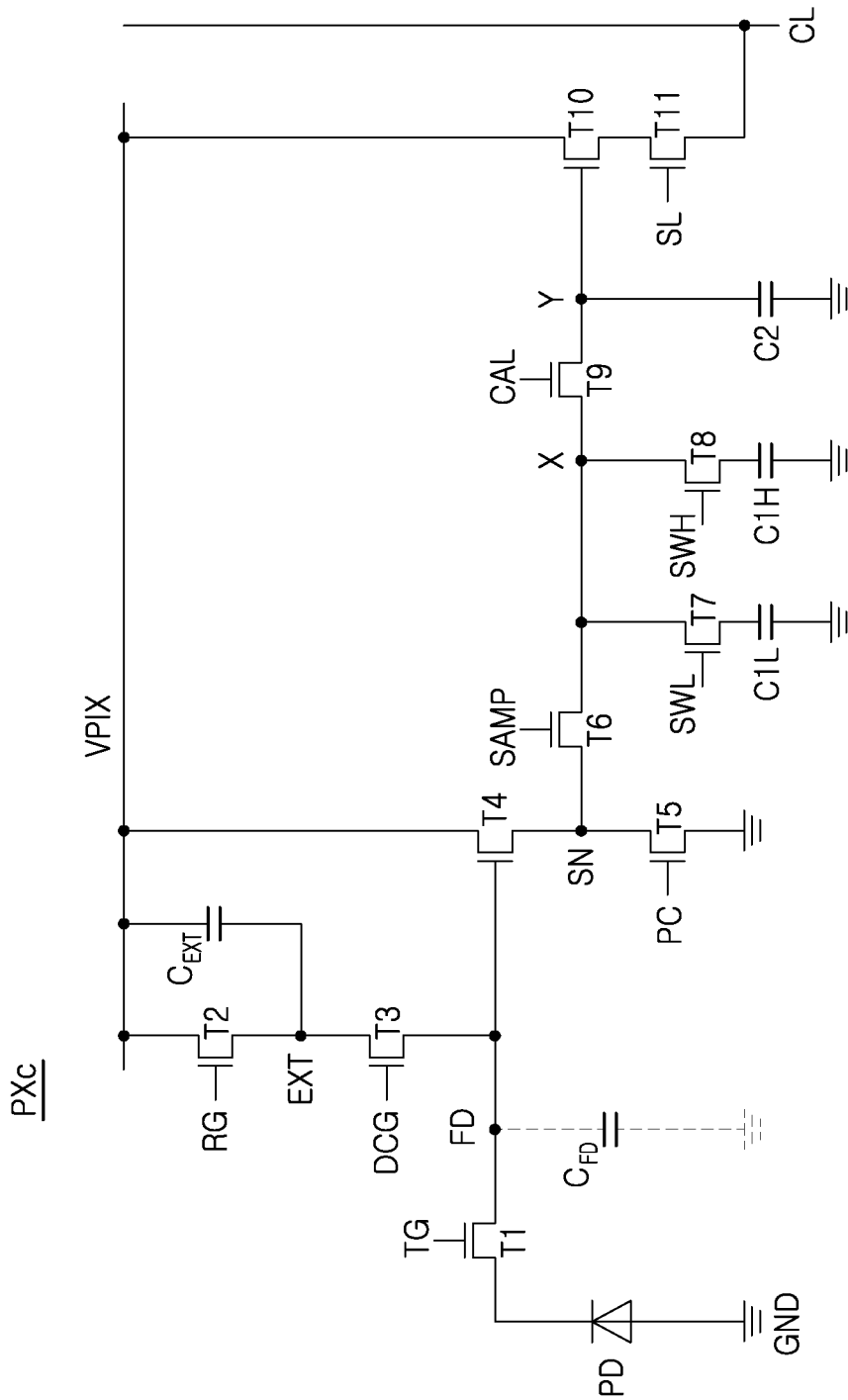
FIG. 9 is a view schematically illustrating a pixel PXc according to another example embodiment.

FIG. 9 is a view schematically illustrating a pixel PXc according to another example embodiment. Referring to FIG. 9, the pixel PXc differs from the pixel PX illustrated in FIG. 3 in a connection relationship between the sampling capacitors C1L, C1H, and C2.

As shown in FIG. 9, the sampling capacitors C1L, C1H, and C2 may be connected in a pi (π) structure. First and second switches SWL and SWH may be connected to a first sampling node. The first sampling capacitor C1L for the first illumination may be connected to the first switch SWL and a ground terminal GND, and the second sampling capacitor C1H for the second illumination may be connected between the second switch SWH and a ground terminal GND. The ninth transistor T9 may connect a first sampling node X and a second sampling node Y in response to an operating signal CAL. The third sampling capacitor C2 may be connected between the second sampling node Y and a ground terminal GND.

In embodiments, the pixel according to an example embodiment may share a plurality of photodiodes.

Figure 10:
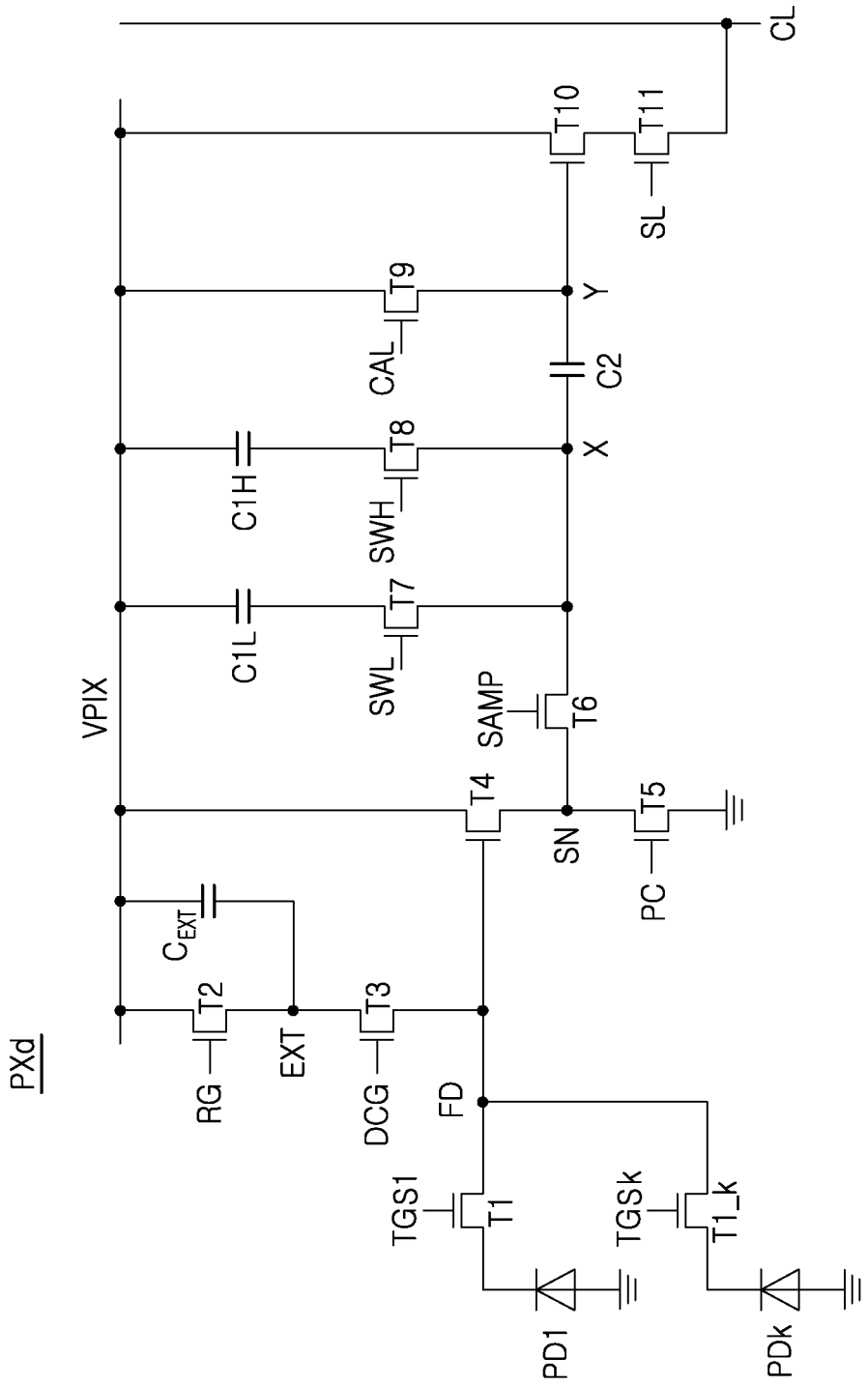
FIG. 10 is a view schematically illustrating a pixel PXd according to another example embodiment.

FIG. 10 is a view schematically illustrating a pixel PXd according to another example embodiment. Referring to FIG. 10, the pixel PXd differs from the pixel PX illustrated in FIG. 3 in that the pixel PXd includes a plurality of photodiodes PD1, . . . , PDk and a plurality of transfer transistors T1_1, . . . , T1_k. Each of the plurality of transfer transistors T1_1, . . . , T1_k, may transfer charges of the photodiodes PD1, . . . , PDk which are controlled by the corresponding transfer gate signals TGS1, . . . TGSk to a floating diffusion region, which may correspond to floating diffusion node FD.

In embodiments, the pixel according to an example embodiment may be implemented in a 2-PD structure sharing one floating diffusion region.

Also, FIGS. 7 to 10, the left part including the PD based on the node SN may be located on the top plate of the sensor. In addition, the right portion including the transistor T5 may be implemented in a stack shape on the lower plate of the sensor.

In embodiments, the global shutter may include a color filter to process RGB data. In addition, the global shutter can be driven as an IR global shutter by having a transparent layer without a color filter and absorbing infrared rays.

Figure 11:
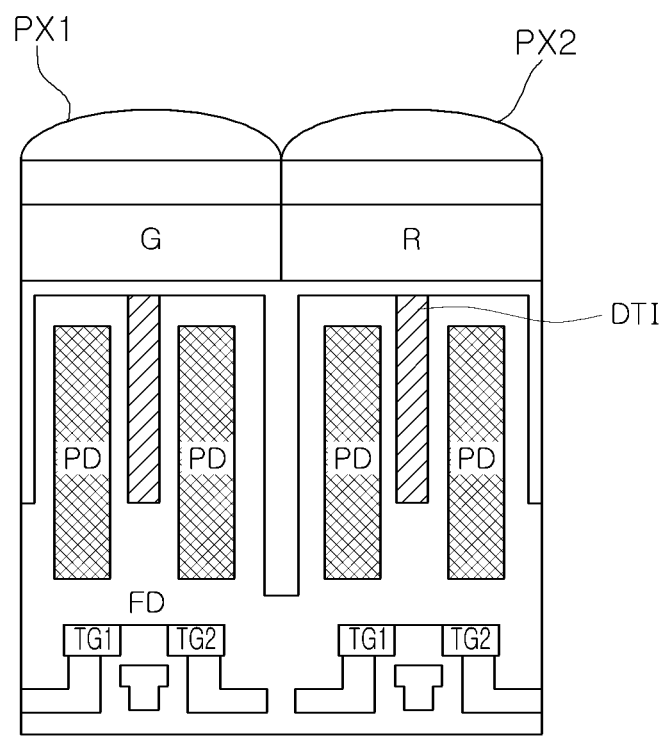
FIG. 11 is a view schematically illustrating pixels of a 2-PD structure according to an example embodiment.

FIG. 11 is a view schematically illustrating pixels of a 2-PD structure. For example, FIG. 11 may show two pixels, a G pixel PX1 and an R pixel PX2, each of which may be a 2-PD pixel having a left PD and a right PD. Referring to FIG. 11, the 2-PD pixel may separate a left PD and a right PD by In-Pixel deep trench isolation (DTI). The floating diffusion region may be commonly connected to a pair of the left PD and the right PD disposed in the pixel. That is, the floating diffusion region may be commonly connected to four photoelectric conversion elements. For example, the floating diffusion region may include N-type impurities. First and second transfer gates TG1 and TG2 disposed on the substrate of the first pixel PX1 and first and second transfer gates TG1 and TG2 disposed on the substrate of the second pixel PX2 may share the floating diffusion region.

In embodiments, the length of DTI between PX1 and PX2 may be longer than that of In-Pixel DTI. In embodiments, the first surface and the second surface of the substrate may be connected by the front deep trench isolation FDTI. In embodiments, In-Pixel DTI may be formed by extending in a portion with a microlens, as shown in FIG. 11. In other embodiments, In-Pixel DTI may be formed by extending in the vicinity of the FD. In embodiments, In-Pixel DTI may be not connected to the substrate.

In embodiments, an image sensor according to an example embodiment may be provided with a plurality of pixel arrays.

Figure 12:
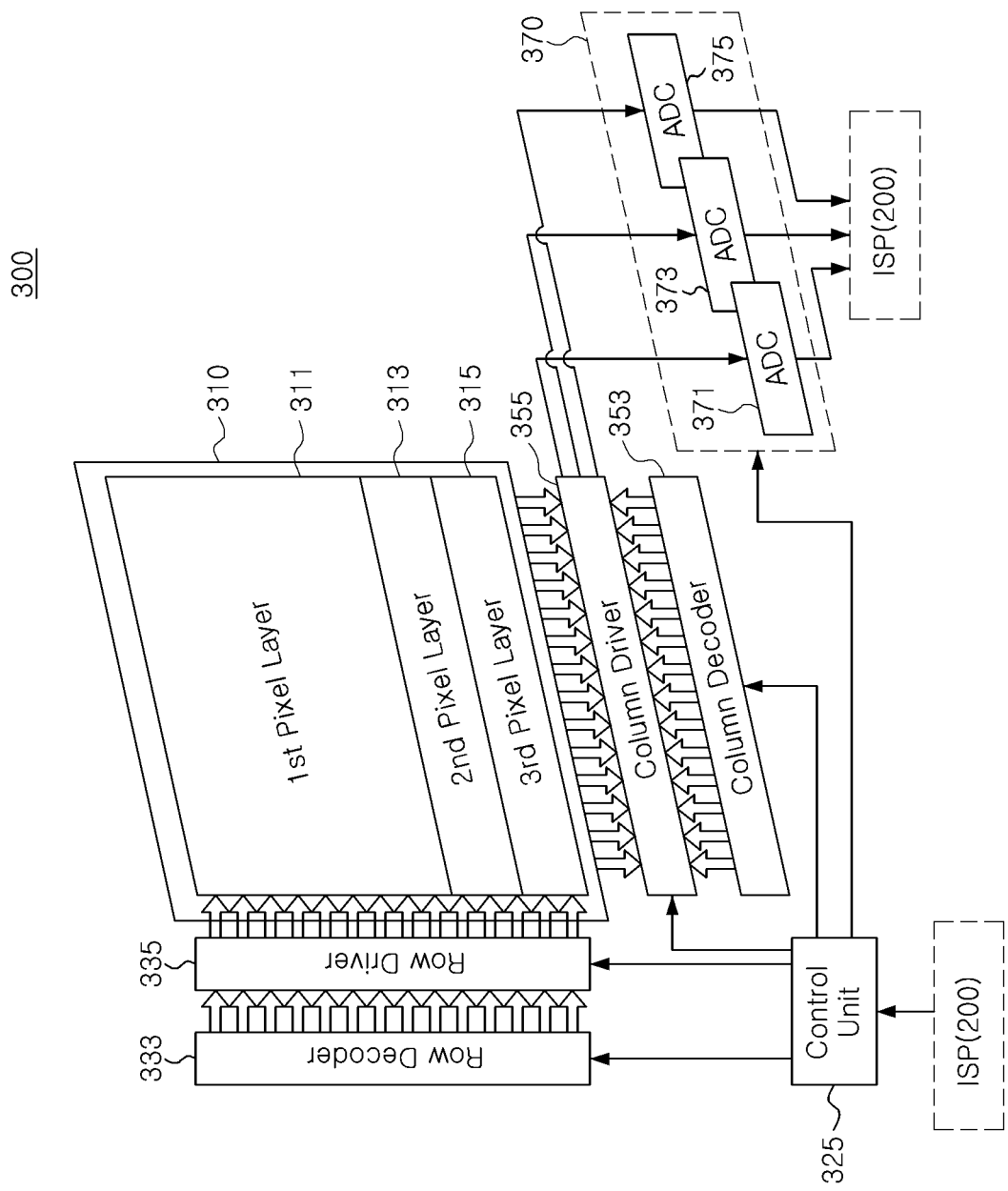
FIG. 12 is a view schematically illustrating an image sensor 300 according to another example embodiment.

FIG. 12 is a view schematically illustrating an image sensor 300 according to another example embodiment. Referring to FIG. 12, the image sensor 300 may include a pixel array 310, a control unit 325, a row decoder 333, a row driver 335, a column decoder 353, a column driver 355, and ADC 370.

The pixel array 310 may detect light reflected from a subject to generate object information and/or and image information of the subject. The pixel array 310 may include a plurality of pixels arranged in a two-dimensional matrix form. The pixel array 310 may include a plurality of pixel layers 311, 313, and 315. In an example embodiment, the first pixel layer 311 may be a color pixel array (CPA). For example, the color pixel array may have pixels of a Bayer pattern. In an example embodiment, the second pixel layer 313 may be a depth pixel array (DPA). For example, the depth pixel array may include a plurality of 2-PD pixels or metal shield pixels. In an example embodiment, the second pixel layer 313 may include at least one temperature sensor for performing depth correction according to the temperature. In an embodiment, the third pixel layer 315 may be a thermal pixel array (TPA). For example, the thermal pixel array may include a plurality of temperature pixels.

In embodiments, each of the plurality of pixel layers 311, 313, and 315 may have at least one pixel performing dual-conversion gain or dual-sampling, as shown in FIGS. 1 to 11.

In embodiments, it should be understood that the number of pixel arrays is not limited thereto. The pixel array according to an example embodiment may include at least two pixel layers performing different functions.

The control unit 325 may generate control signals for controlling an operation of each of the row decoder 333, the row driver 335, the column decoder 353, the column driver 355, and the plurality of ADCs 371, 373, and 375. For example, the control unit 325 may generate a plurality of row control signals for selecting a specific row line among a plurality of row lines included in each of the plurality of stacked pixel layers 311, 313, and 315. In an example embodiment, the control unit 325 may be disposed on a layer different from the pixel array 310.

The row decoder 333 may decode a plurality of row control signals output from the control unit 325, for example, row address signals, and output a plurality of row selection signals according to the decoding result. The row driver 335 may drive pixels included in at least one row from among a plurality of rows included in each of the plurality of pixel layers 311, 313, and 315 in response to each of the plurality of row selection signals output from the row decoder 333.

The column decoder 353 may decode a plurality of column control signals, for example, column address signals output from the control unit 325, and output a plurality of column selection signals according to the decoding result. The column driver 355 may drive each of the plurality of column lines included in each of the plurality of pixel layers 311, 313, and 315 in response to each of the plurality of column selection signals output from the column decoder 353.

In embodiments, although the image sensor 300 illustrated in FIG. 12 includes one row driver 335 and one column driver 355, the present inventive concept needs not be limited thereto. According to example embodiments, the image sensor 300 may include a plurality of row drivers or a plurality of row drivers or a plurality of column drivers for driving row lines or column lines of each of the plurality of pixel layers 311, 313, and 315. In embodiments, the image sensor 300 may include a plurality of row decoders or a plurality of column decoders.

Each of the plurality of ADCs 371, 373, and 375 may analog-to-digital convert signals output from each of the plurality of pixel layers 311, 313, and 315, and may output the analog-digital converted signals as image data to the ISP 200. For example, the image data may include target information or image information.

According to an example embodiment, each of the plurality of ADCs 371, 373, and 375 may further include a CDS circuit for performing correlated double sampling of signals output from each of the plurality of pixel layers 311, 313, and 315. In this case, each of the plurality of ADCs 371, 373, and 375 may compare the correlated double sampled signal and the ramp signal, and output the comparison result as image data.

An image signal processor (ISP) 200 may process to display the image data.

In embodiments, an imaging device 10 according to an example embodiment may be applied to an electronic device.

Figure 13:
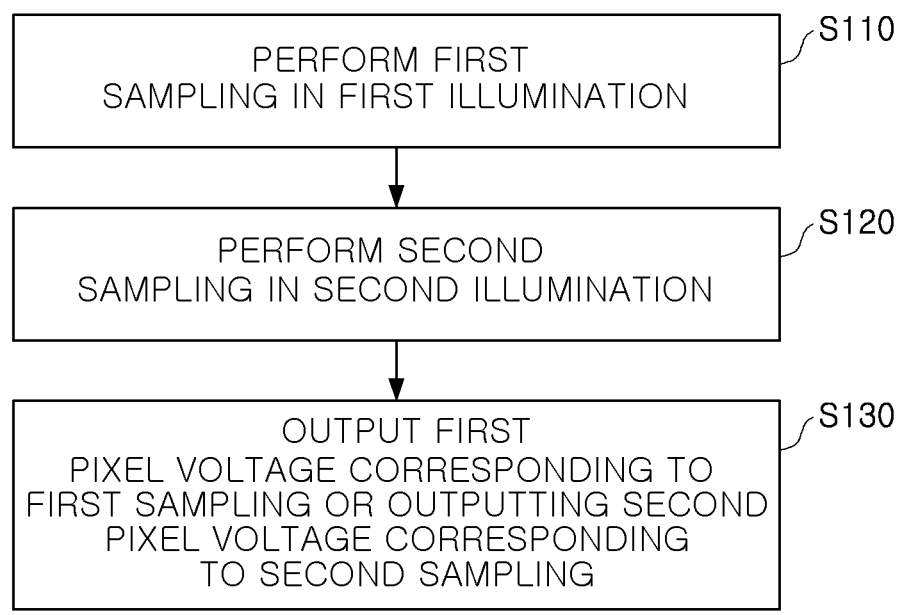
FIG. 13 is a flowchart schematically illustrating an operation of a pixel according to an example embodiment.

FIG. 13 is a flowchart schematically illustrating an operation of a pixel according to an example embodiment. Referring to FIG. 13, the operation of the pixel may proceed as follows.

At operation S110, a first sampling operation corresponding to first illumination may be performed on the pixel PX. Charges corresponding to the first sampling operation may be stored in the capacitor C1L for the first illumination. At operation S120, a second sampling operation corresponding to second illumination may be performed on the pixel PX. Charges corresponding to the second sampling operation may be stored in the capacitor C1H for second illumination. At operation S130, a first pixel voltage corresponding to the first sampling operation may be output, or a second pixel voltage corresponding to the second sampling operation may be output.

As set forth above, according to an example embodiment, an image sensor, an imaging device having the same, and an operation method thereof may implement a wide dynamic range by including pixels performing dual conversion gain and dual sampling.

Various and advantageous advantages and effects of the present inventive concept are not limited to the above description. While example embodiments have been shown and described above, it will be apparent to those skilled in the art that modifications and variations could be made without departing from the scope of the present disclosure, as defined by the appended claims.

What is claimed is:

1. An image sensor, comprising:
   a first sampling capacitor corresponding to first illumination connected to a power supply terminal;
   a second sampling capacitor corresponding to second illumination connected to the power supply terminal;
   a third sampling capacitor connected between a first sampling node and a second sampling node;
   a first transistor connected between a photodiode and a floating diffusion node and configured to be controlled by a transfer gate signal;
   a second transistor connected between the power supply terminal and an expansion node and configured to be controlled by a reset gate signal;
   a third transistor connected between the expansion node and the floating diffusion node and configured to be controlled by a conversion gain gate signal;
   a fourth transistor having a drain connected to the power supply terminal, a source connected to a sampling node, and a gate connected to the floating diffusion node;
   a fifth transistor connected between the sampling node and a ground terminal and configured to be controlled by a pass signal;
   a sixth transistor connected between the sampling node and the first sampling node and configured to be controlled by a sampling signal;
   a seventh transistor connected between the first sampling capacitor and the first sampling node and configured to be controlled by a first switch signal;
   an eighth transistor connected between the second sampling capacitor and the first sampling node and configured to be controlled by a second switch signal;
   a ninth transistor connected between the power supply terminal and the second sampling node and configured to be controlled by an operating signal;
   a tenth transistor having a drain connected to the power supply terminal and a gate connected to the second sampling node; and
   an eleventh transistor connected between a source of the tenth transistor and a corresponding column line and configured to be controlled by a selection signal.

2. The image sensor of claim 1, further comprising an expansion capacitor connected between the expansion node and the ground terminal.

3. The image sensor of claim 2, further comprising a secondary photodiode connected between the expansion node and the ground terminal.

4. The image sensor of claim 1, further comprising an expansion capacitor connected between the expansion node and the power supply terminal.

5. The image sensor of claim 1, wherein based on the conversion gain gate signal being at a high level, charges overflowed from the photodiode are stored in the first sampling capacitor.

6. The image sensor of claim 5, wherein after the overflowed charges are stored in the first sampling capacitor for the first illumination, based on the conversion gain gate signal being at a low level, and the transfer gate signal being at the high level for a predetermined time, charges corresponding to the second illumination are stored in the floating diffusion node.

7. The image sensor of claim 6, wherein based on the transfer gate signal being at the low level, and the second switch signal being at the high level, a second sampling operation for storing the charges corresponding to the second illumination in the second sampling capacitor is performed.

8. The image sensor of claim 7, wherein after the second sampling operation is performed, based on the conversion gain gate signal being at the low level, and the transfer gate signal being at the high level for the predetermined time, charges corresponding to the first illumination are stored in the floating diffusion node.

9. The image sensor of claim 8, wherein based on the transfer gate signal being at the low level and the first switch signal being at the high level, a first sampling operation for storing the charges corresponding to the first illumination in the first sampling capacitor is performed.

10. The image sensor of claim 1, wherein the first illumination is higher than the second illumination.

11. An imaging device, comprising:
  at least one pixel array having a plurality of pixels connected between a plurality of row lines and a plurality of column lines;
  a row driver configured to select row lines from among the plurality of row lines;
  a read-out circuit configured to receive analog pixel signals from column lines from among the plurality of column lines corresponding to pixels from among the plurality of pixels connected to the selected row lines, and to convert the received analog pixel signals into digital signals;
  a column driver configured to output image data corresponding to the column lines based on the digital signals;
  a timing controller configured to control an operation timing of the at least one pixel array, the row driver, the read-out circuit, and the column driver; and
  an image signal processor configured to process the image data output from the column driver,
  wherein each of the plurality of pixels is configured to perform a first sampling operation corresponding to first illumination and a second sampling operation corresponding to second illumination lower than the first illumination,
  wherein the each of the plurality of pixels comprises a plurality of sampling capacitors connected to a power supply terminal, a plurality of transistors connected between the plurality of sampling capacitors and a first sampling node, an additional sampling capacitor connected between the first sampling node and a second sampling node, a first additional transistor having a drain connected to the power supply terminal, a source connected to an additional sampling node, and a gate connected to a floating diffusion node, and a second additional transistor connected between the additional sampling node and a ground terminal and configured to be controlled by a pass signal.

12. The imaging device of claim 11, wherein the each of the plurality of pixels is configured to perform a conversion gain variation operation.

13. The imaging device of claim 11, wherein the each of the plurality of pixels includes at least two photodiodes.

14. The imaging device of claim 11, wherein the each of the plurality of pixels comprises:
  a first sampling capacitor from among the plurality of sampling capacitors, wherein the first sampling capacitor corresponds to the first illumination and is connected to the power supply terminal;
  a second sampling capacitor from among the plurality of sampling capacitors, wherein the second sampling capacitor corresponds to the second illumination and is connected to the power supply terminal;
  a first transistor connected between a photodiode and the floating diffusion node and configured to be controlled by a transfer gate signal;
  a second transistor connected between the power supply terminal and an expansion node and configured to be controlled by a reset gate signal;
  a third transistor connected between the expansion node and the floating diffusion node and configured to be controlled by a conversion gain gate signal;
  a sixth transistor connected between the additional sampling node and the first sampling node and configured to be controlled by a sampling signal;
  a seventh transistor from among the plurality of transistors, wherein the seventh transistor is connected between the first sampling capacitor and the first sampling node and is configured to be controlled by a first switch signal;
  an eighth transistor from among the plurality of transistors, wherein the eighth transistor is connected between the second sampling capacitor and the first sampling node and is configured to be controlled by a second switch signal;
  a ninth transistor connected between the power supply terminal and the second sampling node and configured to be controlled by an operating signal;
  a tenth transistor having a drain connected to the power supply terminal and a gate connected to the second sampling node; and
  an eleventh transistor connected between a source of the tenth transistor and a corresponding column line and configured to be controlled by a selection signal.

15. The imaging device of claim 14, further comprising:
  an expansion capacitor connected between the expansion node and the ground terminal; and
  a secondary photodiode connected between the expansion node and the ground terminal.

16. An operating method of an image sensor, the operating method comprising:
  performing a first sampling operation corresponding to first illumination in at least one pixel, wherein each pixel of the at least one pixel comprises a plurality of sampling capacitors connected to a power supply terminal, a plurality of sampling transistors connected between the plurality of sampling capacitors and a first sampling node, an additional sampling capacitor connected between the first sampling node and a second sampling node, a first additional transistor having a drain connected to a power supply terminal, a source connected to an additional sampling node, and a gate connected to a floating diffusion node, and a second additional transistor connected between the additional sampling node and a ground terminal and configured to be controlled by a pass signal;
  performing a second sampling operation corresponding to second illumination in the at least one pixel; and
  outputting a first pixel voltage corresponding to the first sampling operation, or outputting a second pixel voltage corresponding to the second sampling operation, in the at least one pixel.

17. The operating method of the image sensor of claim 16, wherein the at least one pixel is configured to perform dual-conversion gain.

18. The operating method of the image sensor of claim 16, further comprising performing light-emitting diode (LED) flicker mitigation using a secondary photodiode in the at least one pixel.

19. The operating method of the image sensor of claim 16, further comprising storing overflowed charges corresponding to the first illumination in a capacitor of the plurality of sampling capacitors.

\* \* \* \* \*